(12) United States Patent
Park et al.

(10) Patent No.: US 8,594,590 B2
(45) Date of Patent: Nov. 26, 2013

(54) METHOD FOR CONTROLLING PEAK-TO-AVERAGE POWER RATIO OF SINGLE CARRIER FDMA SYSTEM

(75) Inventors: Young-Seo Park, Yongin-shi (KR); Yadunandana N. Rao, Sunrise, FL (US); Darrell J. Stogner, Plantation, FL (US)

(73) Assignee: Motorola Solutions, Inc., Schaumburg, IL (US)

( * ) Notice: Subject to any disclaimer, the term of this patent is extended or adjusted under 35 U.S.C. 154(b) by 131 days.

(21) Appl. No.: 12/982,989

(22) Filed: Dec. 31, 2010

(65) Prior Publication Data
US 2012/0171975 A1    Jul. 5, 2012

(51) Int. Cl.
*H04B 1/04* (2006.01)

(52) U.S. Cl.
USPC ......... 455/114.2; 375/146; 375/260; 375/296

(58) Field of Classification Search
USPC ...................................................... 455/114.2
See application file for complete search history.

(56) References Cited

U.S. PATENT DOCUMENTS

| | | | | |
|---|---|---|---|---|
| 5,287,387 A * | 2/1994 | Birchler | ......................... | 375/296 |
| 5,638,403 A * | 6/1997 | Birchler et al. | ............... | 375/296 |
| 6,735,423 B1 * | 5/2004 | Uskali et al. | ............... | 455/249.1 |
| 7,003,017 B2 * | 2/2006 | Hunton | .......................... | 375/146 |
| 7,409,009 B2 * | 8/2008 | Akhtman | ....................... | 375/296 |
| 8,098,744 B2 * | 1/2012 | Chen et al. | ..................... | 375/260 |
| 2007/0217543 A1 * | 9/2007 | Hamada et al. | ............... | 375/296 |
| 2008/0267312 A1 * | 10/2008 | Yokoyama | .................... | 375/267 |

* cited by examiner

*Primary Examiner* — Ajibola Akinyemi
(74) *Attorney, Agent, or Firm* — Steven A. May

(57) ABSTRACT

A method for controlling peak-to-average power ratio prior to amplification by a power amplifier is provided. The peak sample of a signal is predicted, window length is adjusted based on the peak width around the peak sample or subcarriers used to transmit the signal, and the window is subsequently used to clip the samples. A peak suppression window may be applied prior to predicting the peak sample when a set number of samples exceed a predetermined threshold. Window clipping may be deactivated if interference and throughput of the power amplifier is detrimentally affected. A pulse shaping filter may be optimized based on the window clipping to control transmitted signal characteristics. Various thresholds used in the prediction may be initially based on system design and power amplifier linearity and then dynamically adjusted based on an estimation of active subcarriers or of interferers present in the communication system.

19 Claims, 10 Drawing Sheets

METHOD FOR CONTROLLING PEAK-TO-AVERAGE POWER RATIO OF SINGLE CARRIER FDMA SYSTEM

TECHNICAL FIELD

The present invention relates generally to a method for reducing the peak-to-average power ratio (PAPR) of a communications system. In particular, the invention relates to a method for reducing the PAPR of a Long Term Evolution (LTE) Single Carrier Frequency Division Multiple Access (SC-FDMA) uplink system.

BACKGROUND

Limiting the peak-to-average power ratio in a mobile communication device during an uplink is desirable as the power efficiency of a power amplifier in a transmitter decreases with increasing peak-to-average power ratio. In a mobile communication device, where the power supply is typically limited, any reduction in power efficiency is undesirable. A power amplifier that requires a greater peak-to-average power ratio to operate effectively drains the power supply faster.

LTE systems, which use a LTE Single Carrier Frequency Division Multiple Access (SC-FDMA) uplink system, are becoming increasingly popular for use with mobile communication devices. It is thus often desirable to reduce the peak-to-average power ratio of such a system. $3^{rd}$ Generation Partnership Project (3GPP) defines LTE as a mobile communications system that provides downlink peak rates of at least 100 megabits per second (Mbit/s), uplink peak rates of at least 50 Mbit/s, and radio access network (RAN) round-trip times of less than 10 milliseconds (ms). The terms uplink and downlink refer to transmission paths connecting two communication devices. An uplink refers to data being transmitted from the mobile communication device to a base station. A downlink refers to data being transmitted from the base station to the mobile communication device. LTE SC-FDMA is defined in the 3GPP specification for LTE.

LTE uplink systems use SC-FDMA, generally as SC-FDMA has a lower peak-to-average power ratio than other types of multiple access digital modulation schemes, such as Orthogonal Frequency Division Multiplexing Access (OFDMA). This lower peak-to-average power ratio is due to the inherent single carrier structure of LTE SC-FDMA. However, although LTE SC-FDMA generally has a lower peak-to-average power ratio, LTE transmitters tend to increase peak-to-average power ratio for a number of reasons. One such reason is the use of pulse shaping filters in the LTE transmitters. The pulse shaping filters are used to reduce out-of-band emission (OOBE), at the expense of causing an increase in peak-to-average power ratio.

It would be desirable to provide an effective suppression scheme in an LTE SC-FDMA system to reduce peak-to-average power ratio in conjunction with providing an efficient power amplifier for use in an LTE uplink system.

SUMMARY

Methods and communication devices for suppressing a peak-to-average power ratio of a LTE SC-FDMA communications system effectively by window clipping is provided. One method for controlling peak-to-average power ratio prior to amplification by a power amplifier includes sampling an input signal to produce a series of digital samples. The peak sample is the predicted and the length of a window is adjusted based on either the peak width around the peak sample or the number of subcarriers used to transmit the signal. After adjustment, the window is subsequently used to clip the samples. Individual adjacent samples, as well as combinations of the samples, are compared against different thresholds to predict the peak sample. Peak prediction accuracy may be enhanced by providing interpolation near the peak sample.

In other embodiments, a peak suppression window may be applied prior to predicting the peak sample when a set number of samples exceed a predetermined threshold. Additionally, window clipping may be deactivated if interference and/or throughput of the power amplifier is detrimentally affected. A pulse shaping filter may be optimized based on the window clipping to control transmitted signal characteristics. Various thresholds used in the prediction may be initially based on system design and power amplifier linearity and then dynamically adjusted based on an estimation of active subcarriers or of interferers present in the communication system.

The scope of the present invention is defined solely by the appended claims and is not affected by the statements within this summary.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

Methods for controlling the peak-to-average power ratio in a communication device, such as a mobile communication device, are presented. Window clipping of samples of an uplink signal communicated in an LTE SC-FDMA scheme are used in the various methods. As a result, the peak-to-average power ratio of the uplink signal can be suppressed to a desirable point, such as to less than or equal to 7 dB, which is sufficient ensure efficient amplification by a power amplifier in the transmitter of the communication device.

Figure 1:
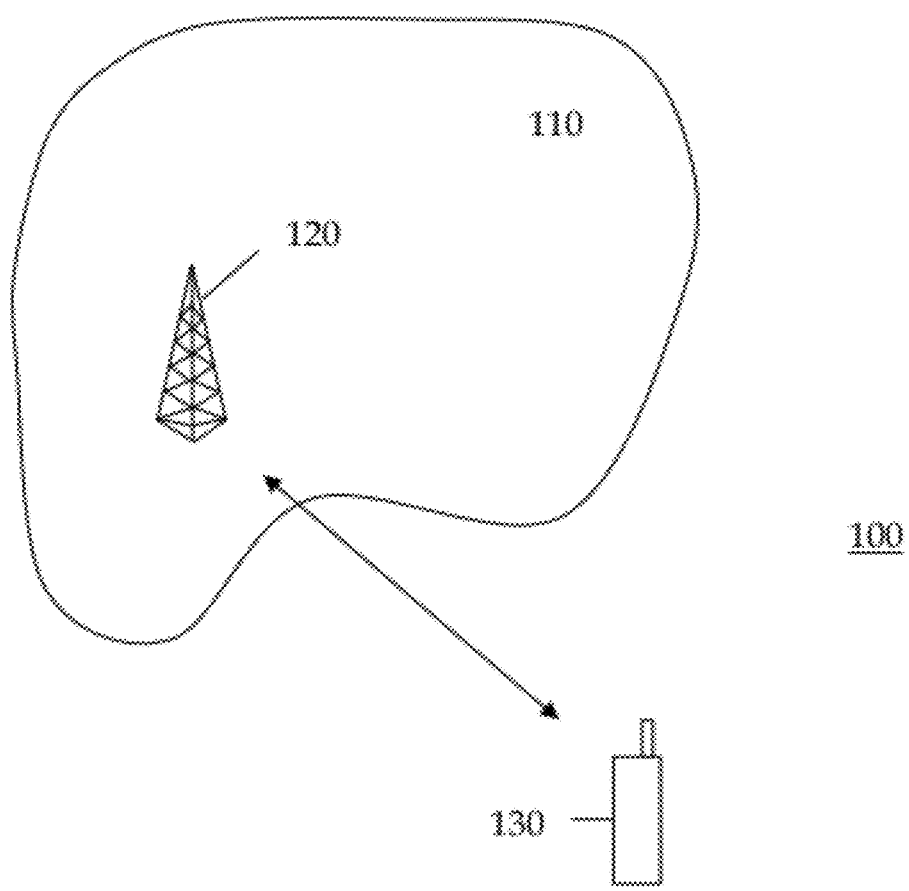
FIG. 1 illustrates an embodiment of a communication system.

FIG. 1 illustrates a communication system 100 that includes an infrastructure 110. There are many distributed elements in the infrastructure 110, some local to each other others disposed geographically distant from each other. Such elements include a base station 120, which provides connectivity for a communication device 130 disposed within the coverage area serviced by the base station 120 to other devices either in the same coverage area or in a different coverage area through the infrastructure 110. The communication device 130 can be, for example, a cellular telephone, personal digital assistant, or a communication device used by emergency personnel.

Figure 2:
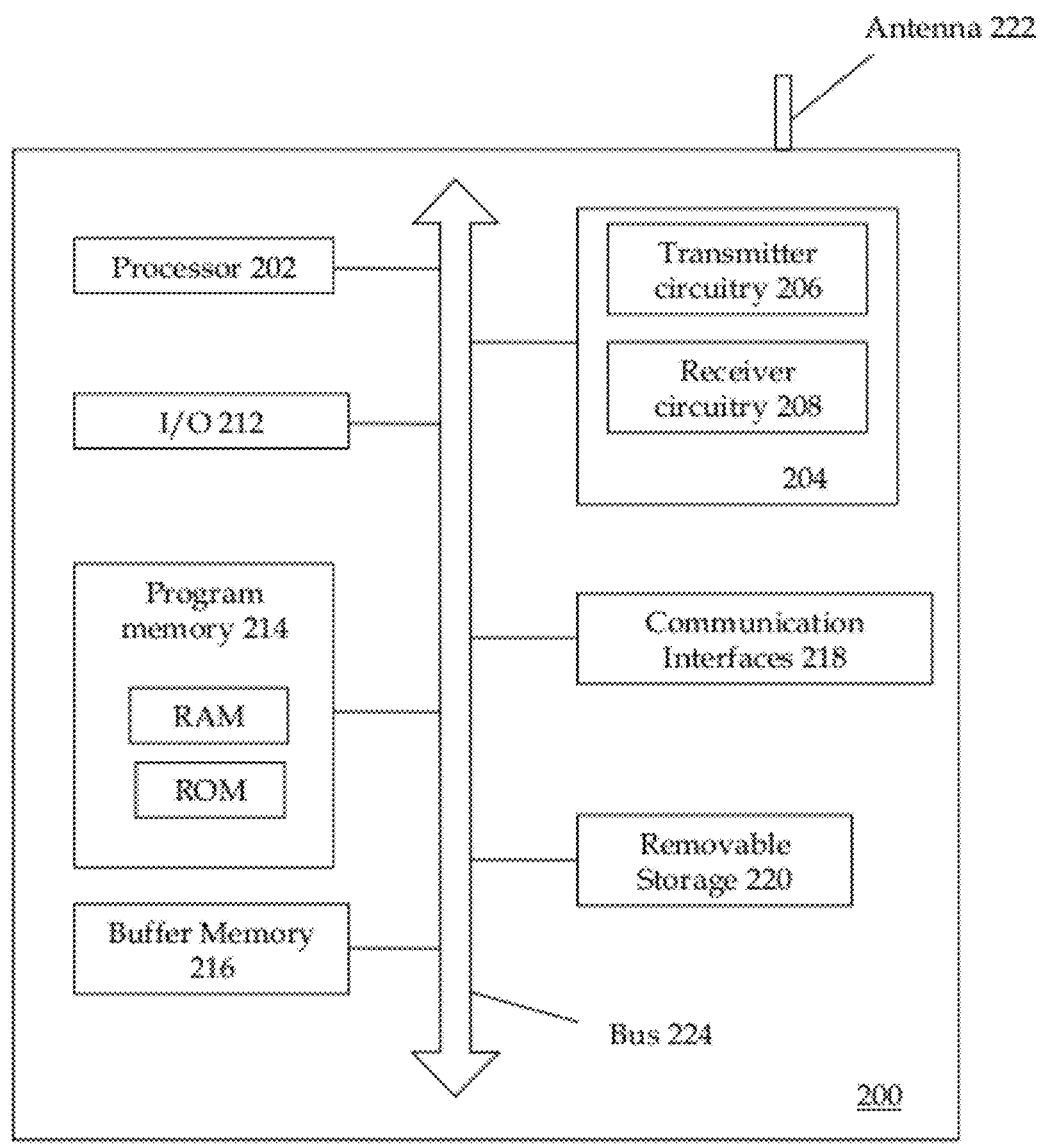
FIG. 2 illustrates a block diagram of an embodiment of a communication device.

An embodiment of one such communication device is shown in the block diagram of FIG. 2. The communication device 200 may contain, among other components, a processor 202, a transceiver 204 including transmitter circuitry 206 and receiver circuitry 208, an antenna 222, I/O devices 212, a program memory 214, a buffer memory 216, one or more communication interfaces 218, and removable storage 220. The communication device 200 is preferably an integrated unit and may contain at least all the elements depicted in FIG. 2 as well as any other element necessary for the communication device 200 to perform its electronic functions. The electronic elements are connected by a bus 224.

The processor 202 includes one or more microprocessors, microcontrollers, DSPs, state machines, logic circuitry, or any other device or devices that process information based on operational or programming instructions. Such operational or programming instructions are stored in the program memory 214 and may include instructions such as estimation and correction of a received signal, encryption/decryption, and decisions about whether an alarm exists that are executed by the processor 202 as well as information related to the transmit signal such as modulation, transmission frequency or signal amplitude. The program memory 214 may be an IC memory chip containing any form of random access memory (RAM) and/or read only memory (ROM), a floppy disk, a compact disk (CD) ROM, a hard disk drive, a digital video disk (DVD), a flash memory card or any other medium for storing digital information. One of ordinary skill in the art will recognize that when the processor 202 has one or more of its functions performed by a state machine or logic circuitry, the memory 214 containing the corresponding operational instructions may be embedded within the state machine or logic circuitry. The operations performed by the processor 202 and the rest of the communication device 200 are described in detail below.

The transmitter circuitry 206 and the receiver circuitry 208 enable the communication device 200 to respectively transmit and receive communication signals, for example to a base station or other communication device. In this regard, the transmitter circuitry 206 and the receiver circuitry 208 include appropriate circuitry to enable wireless transmissions. The implementations of the transmitter circuitry 206 and the receiver circuitry 208 depend on the implementation of the communication device 200 and the devices with which it is to communicate. For example, the transmitter and receiver circuitry 206, 208 may be implemented as part of the communication device hardware and software architecture in accordance with known techniques. One of ordinary skill in the art will recognize that most, if not all, of the functions of the transmitter or receiver circuitry 206, 208 may be implemented in a processor, such as the processor 202. However, the processor 202, the transmitter circuitry 206, and the receiver circuitry 208 have been artificially partitioned herein to facilitate a better understanding. The buffer memory 216 may be any form of volatile memory, such as RAM, and is used for temporarily storing received or transmit information.

The communication device 200 may also contain a variety of I/O devices such as a keyboard with alpha-numeric keys, a display (e.g., LED, OELD) that displays information about the base station or communications connected to the base station, soft and/or hard keys, touch screen, jog wheel, a microphone, and a speaker.

The communication device transmits to, e.g., the base station using an uplink channel. In particular, the communication device uses an LTE uplink system in which an LTE SC-FDMA scheme with localized frequency division multiple access (LFDMA) is used in the transmission. The LTE SC-FDMA system also includes pulse shaping to limit the out-of-band emissions. The out-of-band emissions are typically regulated by the Federal Communications Commission (FCC), which sets a spectral mask to prevent leakage of harmful RF interference into adjacent channels. Pulse shaping is a standard way of limiting out-of-band emissions and is widely used in most communication systems. Pulse shaping however increases the peak-to-average power ratio thereby creating a trade-off between the out-of-band emissions and peak-to-average power ratio performance.

Figure 3:
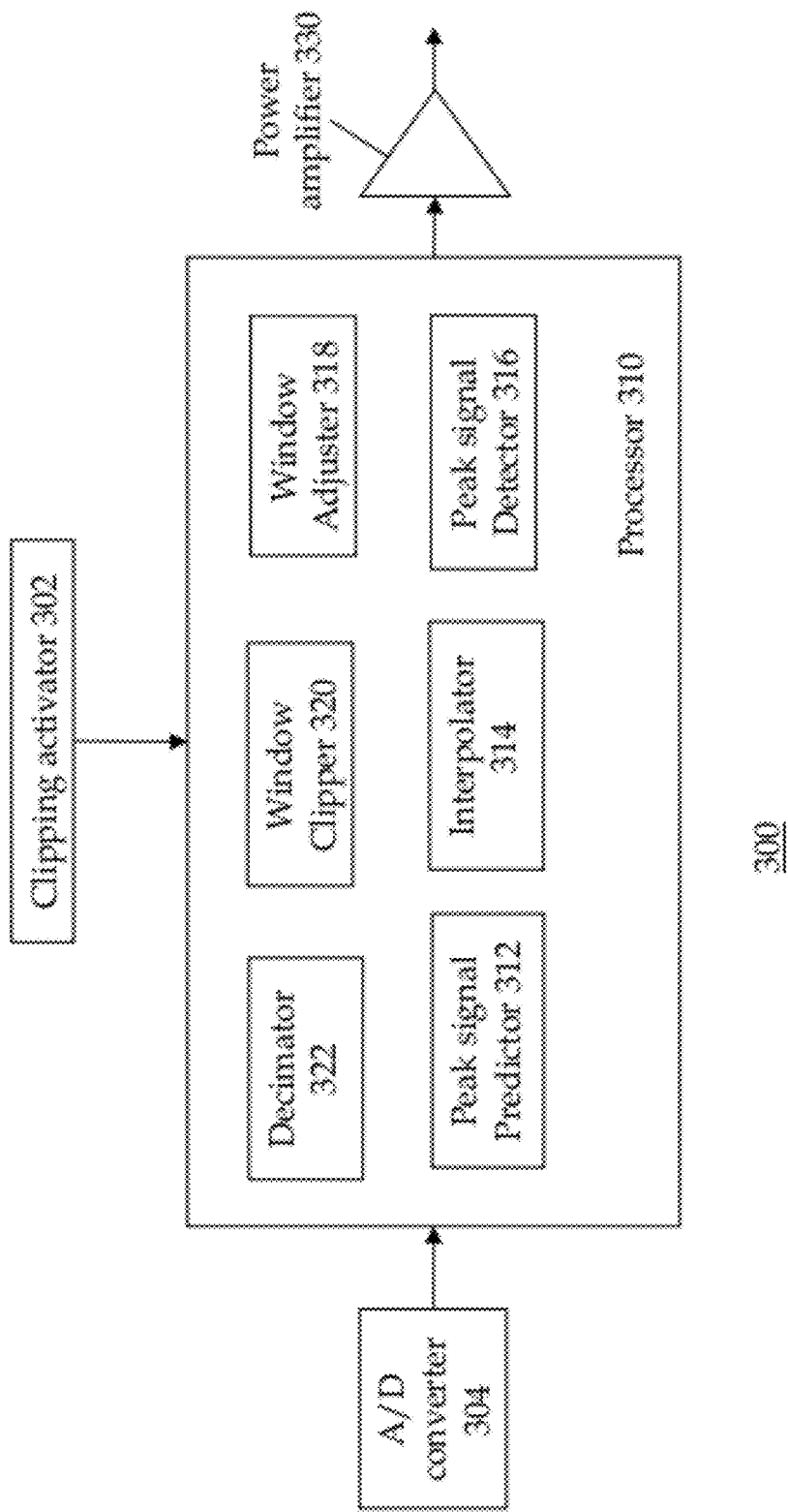
FIG. 3 illustrates another block diagram of an embodiment of a communication device.

FIG. 3 illustrates one embodiment of communication device with emphasis on the processor. Many other modules internal and external to the processor 310 (e.g., to provide DC offset correction or other functionality) may be present in the communication device 100 but are not illustrated for convenience. As shown, an analog signal to be transmitted is sampled using an analog-to-digital (A/D) converter 304, processed by the processor 310, and then provided to the power amplifier 330. The samples supplied to the processor 310 are thus baseband samples, which are later upconverted into the desired RF domain using one or more local oscillators, mixers and phase shifters (for complex signal transmission) (not shown for convenience) followed by amplification by the power amplifier 330. The processor 310 provides a number of processes (shown as modules in FIG. 3) related to the adjustable window clipping functionality selectably activated by a clipping activator 302. The processes include a peak signal predictor 312, interpolator 314, peak signal detector 316, window adjuster 318, window clipper 320 and decimator 322. Some or all of these processes may be followed within the processor 310, depending on the embodiment.

Figure 4:
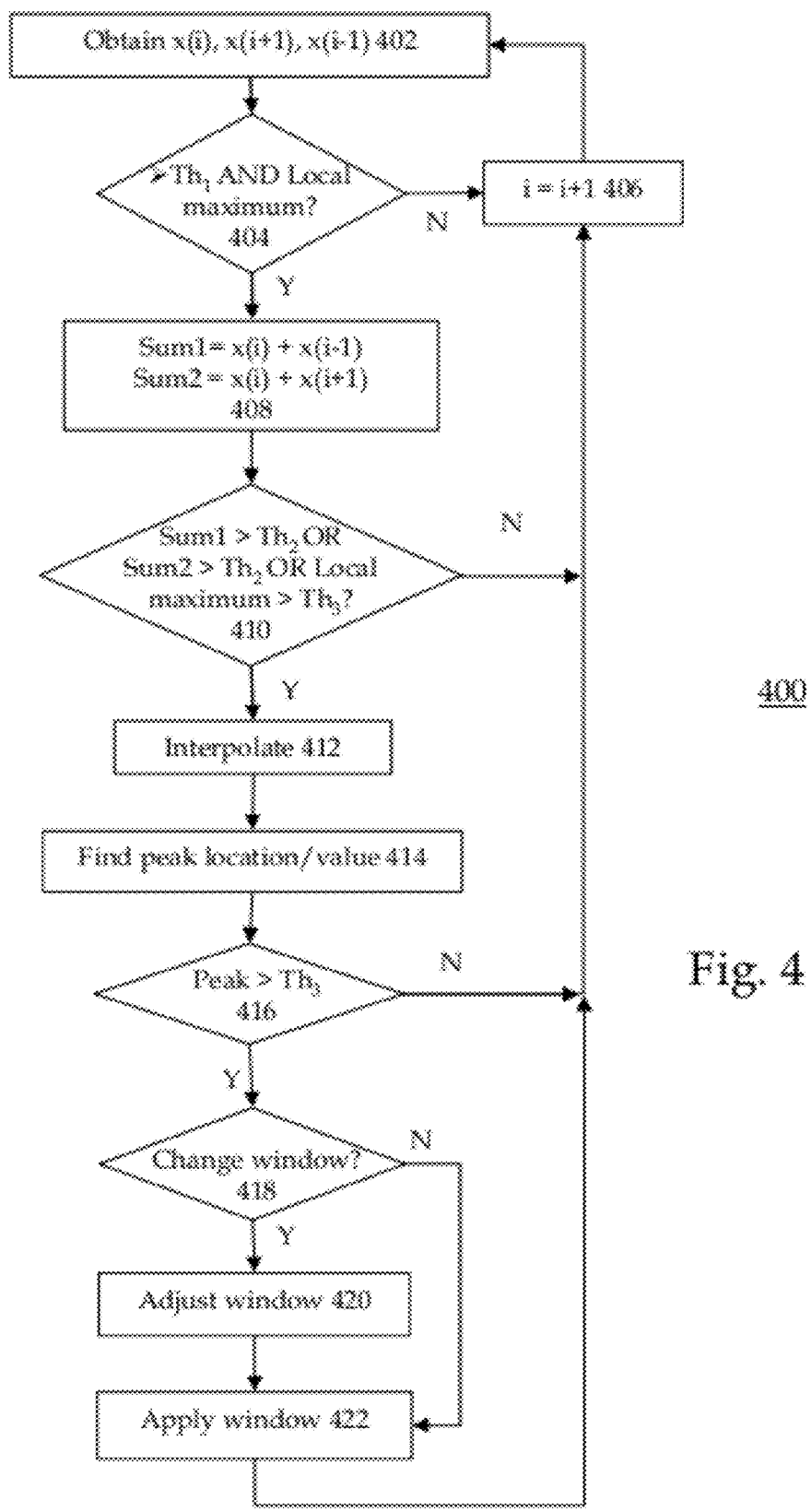
FIG. 4 illustrates a flowchart of one embodiment of controlling the peak-to-average power ratio.

FIG. 4 illustrates a flowchart of one embodiment of controlling a peak-to-average power ratio of a LTE SC-FDMA system running on a communication device using window clipping. The method includes hardware components, software components, and/or firmware components and/or some combination thereof Window clipping applies a window to a signal. The window diminishes the amplitudes of a signal outside of a particular interval defined by the window. Different types of windows may be used for window clipping, including rectangular, Hamming, Hanning, triangular, Tukey, Cosine, Lanczos, Gaussian, Bartlett-Hanning, Blackman, Kaiser, Nuttall, Blackman-Harris, Blackman-Nuttall, and flat top windows.

Window clipping is different from conventional clipping. Conventional clipping limits a peak sample (a maximum sample from the A/D converter), so that the amplitude of a peak sample is replaced with a sample having a predetermined amplitude. While this is fairly easy to perform, the abrupt change of a signal's peak amplitude causes out-of-band spectrum growth and generates adjacent channel interference (ACI). If the abrupt change of the peak amplitude is smoothed out however, the out-of-band spectral component may be reduced. Window clipping minimizes this abrupt change by suppressing the amplitudes of peak samples and amplitudes of samples adjacent to the peak samples.

As shown in FIG. 4, multiple thresholds are used to predict whether a peak sample is present before applying window clipping if a peak sample is determined to be present. The thresholds are initially set a priori, e.g., before shipping the communication device. The thresholds may then be programmable in the field, either manually by the user or automatically by the communication device or a controller in communication with the communication device. The thresholds can be programmed to be a fixed value based on the system design and the linearity of a power amplifier estimated initially via simulation. For example, the thresholds can be dynamically adjusted in an adaptive manner based on an estimate of the number of active subcarriers in a SC-FDMA waveform, or using a known interference detection technique to estimate various interferers that may be present in the communication system.

The processor block 310 processes the power or the magnitude of the digitized baseband samples. In the discussion to follow, x(i) is used to denote the power or magnitude of the digitized baseband samples at time instant 'i'. Input samples x(i−1) (immediately previous sample to the current sample), x(i) (current sample) and x(i+1) (immediately next sample to the current sample) are obtained at step 402 (e.g., retrieved from device memory). At step 404 it is determined whether the current sample x(i) is greater than a first threshold and whether the current sample x(i) corresponds to a local maximum. The check for local maximum is done by comparing the next sample x(i+1) to the current sample x(i). If the next sample x(i+1) is smaller than the current sample x(i), the current sample x(i) is considered to be a local maximum (or a local peak). The first threshold is set high enough to, as a rough estimate, indicate that the current sample x(i) may be a local peak sample (i.e., a local maximum). If it is determined at step 404 that the current sample x(i) is not greater than the first threshold, at step 406, the process continues to the next sample x(i+1).

If it is determined at step 404 that the current sample x(i) is greater than the first threshold and the current sample x(i) is a local maximum, at step 408, two summations, x(i)+x(i+1) and x(i)+x(i−1) are computed. At step 410, a comparison is made to check if either of the summations exceeds a second threshold or if the local maximum exceeds a third threshold. If the check at 410 fails, the process returns to step 406. The various thresholds are determined by simulation and thus set, at least initially, in the factory.

As is apparent, the second threshold is larger than the first threshold (as the sum of two samples is being compared against it). The third threshold is also larger than the first threshold as it is being used to confirm that a peak is present. In one embodiment, the third threshold may be obtained by multiplying the first threshold by a factor K, which is greater than 1. In one embodiment, K is chosen to match the difference between the sampling rates at the baseband level where window clipping is applied and the final transmitter waveform as applied to the D/A converter.

Returning to the flowchart 400, at step 410 when it is determined that one of the three conditions are met, it is determined that a hidden peak is predicted to be present between the current and next samples x(i) and x(i+1). Thus, at step 412 a predetermined number of samples (again, set initially and able to be adjusted as desired) nearest to the predicted peak sample are interpolated by a predetermined number to generate a set of interpolated samples. The samples can later be decimated if desired.

Once the interpolation is completed, the location and value of a peak sample is determined at step 414. At step 416, the peak sample is compared against the third threshold to determine if it is a true peak. If the check fails (i.e., the peak sample is less than the third threshold), the process returns to step 406. Once the location and value of the peak sample is determined at step 414 and the peak sample is determined to be a true peak at step 416, at step 418 it is determined whether the window to be applied to the samples to provide window clipping is to be changed. If at step 418 it is determined that the window to be applied is not to be changed, the window is applied at step 420. If at step 418 it is determined that the window to be applied is to be changed, at step 420 the window is adjusted in a manner described below before the window is applied at step 422. The window is positioned within the interpolated signal dependent on the detected location of the peak sample.

Figure 5:
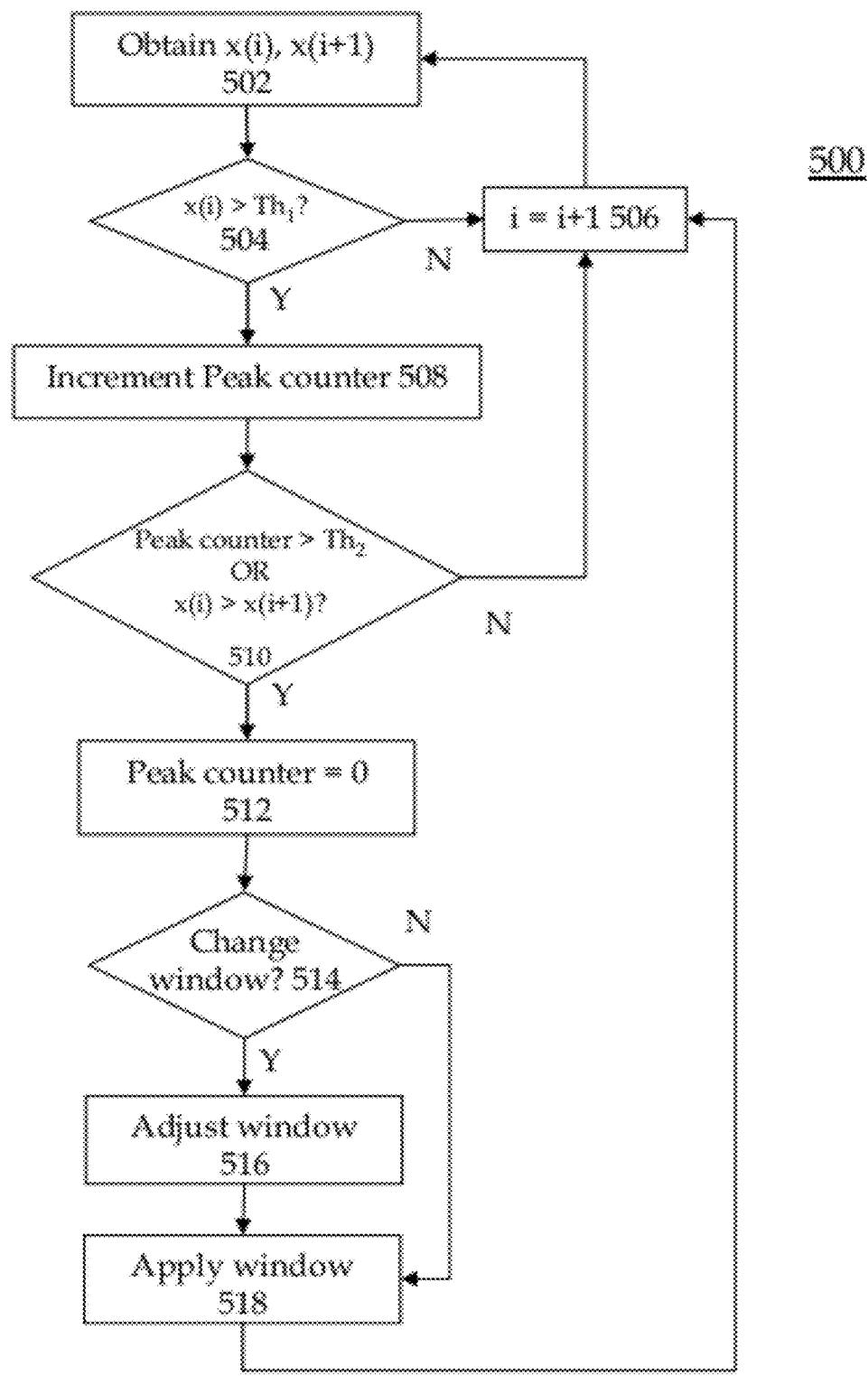
FIG. 5 illustrates a flowchart of another embodiment of controlling the peak-to-average power ratio.

FIG. 5 illustrates a flowchart of another embodiment of controlling a peak-to-average power ratio of a LTE SC-FDMA system running on a communication device using window clipping. Similar to the method of FIG. 4, as shown in FIG. 5, multiple thresholds are used to predict whether a peak sample is present. The current and next samples (x(i), x(i+1)) are obtained at step 502. At step 504, it is determined whether the sample x(i) exceeds a first threshold. If the sample does not exceed the first threshold, then the process returns to step 506. At step 508, a peak counter is incremented. At step 510, the peak counter is compared against a second threshold. Further, at step 510, it is determined whether the sample x(i) is a local maximum (local peak) as described previously. If at least one of these conditions is met, the peak counter is reset, e.g. to zero, at step 512, otherwise, the process returns to step 506.

The peak counter is not reset in FIG. 5 to allow for the case in which the samples are close to the threshold. However, in an alternate embodiment, the peak counter can be reset if a predetermined number of samples fall below the first threshold. In a further embodiment, a combination of these functions can be provided: only if one or more samples fall below the first threshold or another threshold set lower than the first threshold is the peak counter reset if none of the conditions is met.

After the peak counter is reset at step 512, at step 514 it is determined whether the window to be applied to the samples to provide window clipping is to be changed. If at step 514 it is determined that the window to be applied is not to be changed, the window is applied at step 518. If at step 514 it is determined that the window to be applied is to be changed, at step 516 the window is adjusted in a manner described below before the window is applied at step 518.

It should be noted that in this embodiment, the interpolation step is skipped. In an alternative embodiment, interpolation (step 412), determination of the location and value of a peak sample (step 414) and comparison of the peak sample against the third threshold (step 416) may follow step 512 and precede step 514.

Windows applied to the samples are symmetric around a center and taper in amplitude on both sides of the center. Since it is unlikely that a peak would exactly lie on a particular sample (peaks can occur between two samples), the center can be adjusted based on the location of the peak sample. In one embodiment, window is shifted to improve the process of locating the peak sample. To accurately locate the peak sample, the window may be shifted in either direction by a predetermined amount, for example, a ratio of the distance between adjacent samples such as ¼ or ½ of the distance between adjacent samples. This ratio is dependent on the interpolation around the peak sample, which increases the accuracy of positioning the center of the window.

Figure 6:
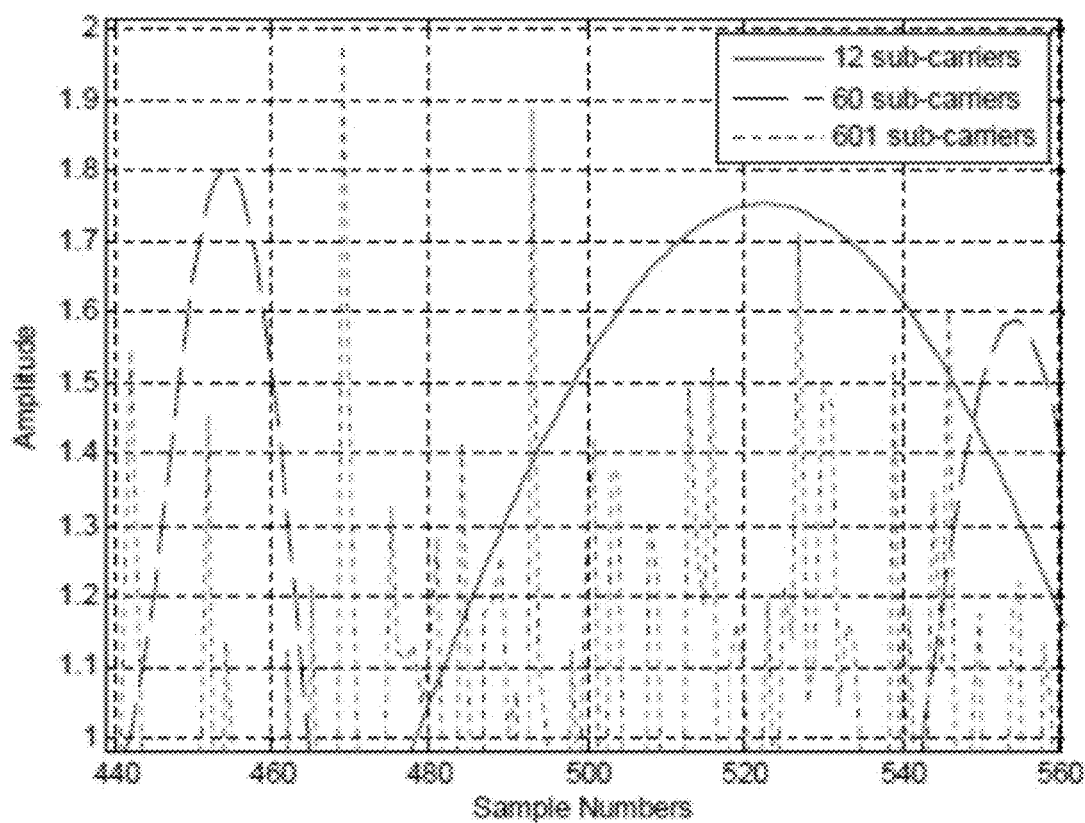
FIG. 6 shows a plot of signal peak width vs. subcarrier number.
Figure 7:
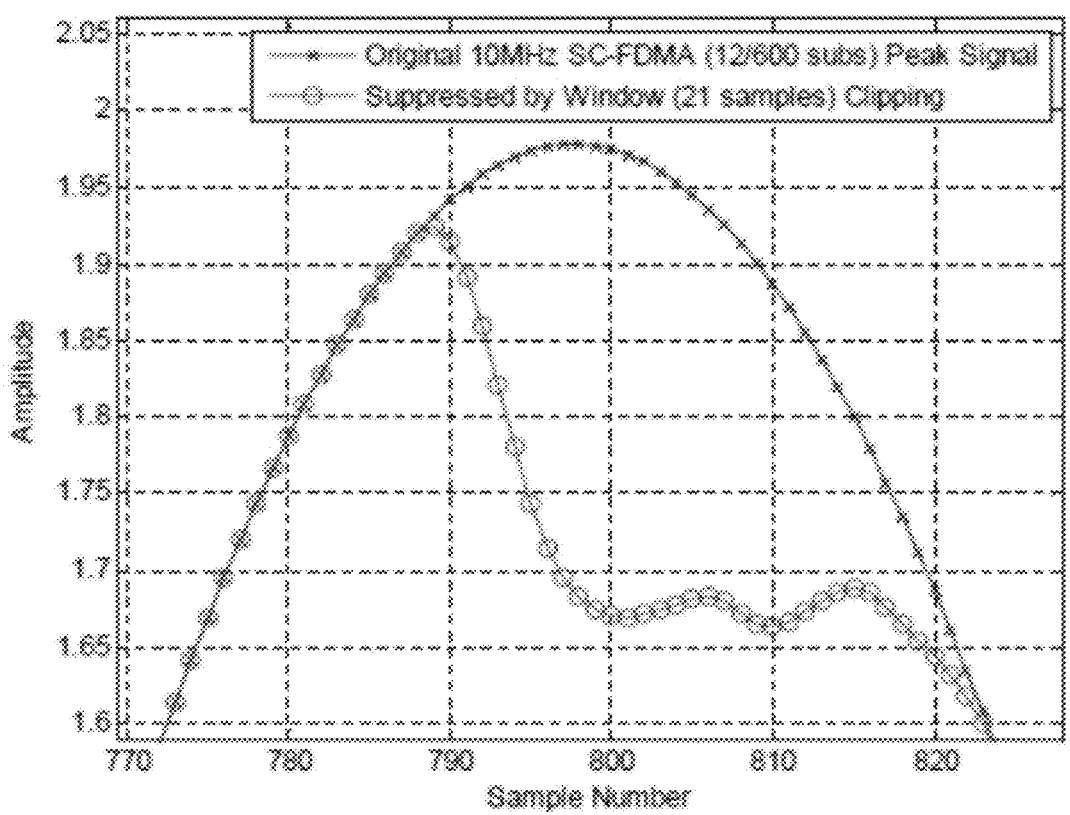
FIG. 7 shows a plot of distortion when using a constant length window.

One of the limitations of using a fixed window length for clipping is that the reduction in peak-to-average power ratio varies depending on the width of the peak signal. The width of the signal peak is a function of the number of subcarriers in a multi-carrier modulation system (each subcarrier is a frequency). Specifically, the width of the signal peak is inversely proportional to the number of subcarriers assigned to transmit the signal, as shown in FIG. 6. Although the number of subcarriers being used may be predetermined and thus known a priori, in general the number of subcarriers of an OFDMA or SC-FDMA system continually changes, which continually changes the peak statistics like width and rate of occurrence. Specifically, the number of subcarriers may be dynamically controlled by a scheduler in a base station serving the communication device. As the number of subcarriers also affects the width of the peak, using a window with a constant length is not practical when the width of the peak sample changes. One example of the distortion that occurs when using a constant length window is shown in the plot of FIG. 7, in which the window is unable to adapt when the peak is longer than the length. As can be observed, using a smaller window size will not adequately clip a wide peak—since the window length is less than peak width, window clipping results in a partial reduction of the peak.

Different techniques may be used to determine the appropriate window length to use—either subcarrier detection or peak width determination. The total number of subcarriers may be detected in real-time using known techniques. Alternatively, the peak width may be used determine the number of subcarriers, e.g., the peak width may be determined by the total number of samples greater than a predetermined threshold. This threshold can be determined empirically based on subcarrier simulation. Subsequently, the window length is adjusted accordingly dependent on the detected number of subcarriers (i.e., narrowed as the number of subcarriers increases) or dependent on the number of samples greater than the subcarrier threshold (i.e., narrowed as the number of samples decreases), depending on the embodiment used. In the latter case, the width of the signal peak may thus be used to control window length.

In addition, a peak suppression window may be applied prior to detection of the peak. The mechanism is similar to the flow diagram in FIG. 5. This is accomplished by determining whether an initial sample exceeds a predetermined suppression threshold, followed by a predetermined number of samples adjacent to the initial sample and each other also exceeding the same suppression threshold. In some embodiments, the following samples may not be adjacent to each other but may be near each other, e.g., within a sample or two of a sample that exceeds the suppression threshold. In this manner, a wide peak is clipped adequately by starting the clipping process early. The suppression threshold may be empirically determined based on the width of the peaks for different subcarrier loading cases and operating sampling rates. This allows a single window length to accommodate clipping of both wide and narrow peaks. For a wide peak, even though the peak may not be reached when a particular sample is being processed, the samples prior to the peak have exceeded a threshold; therefore, by simply counting the number of samples greater than the threshold, window clipping is engaged early.

Figure 8:
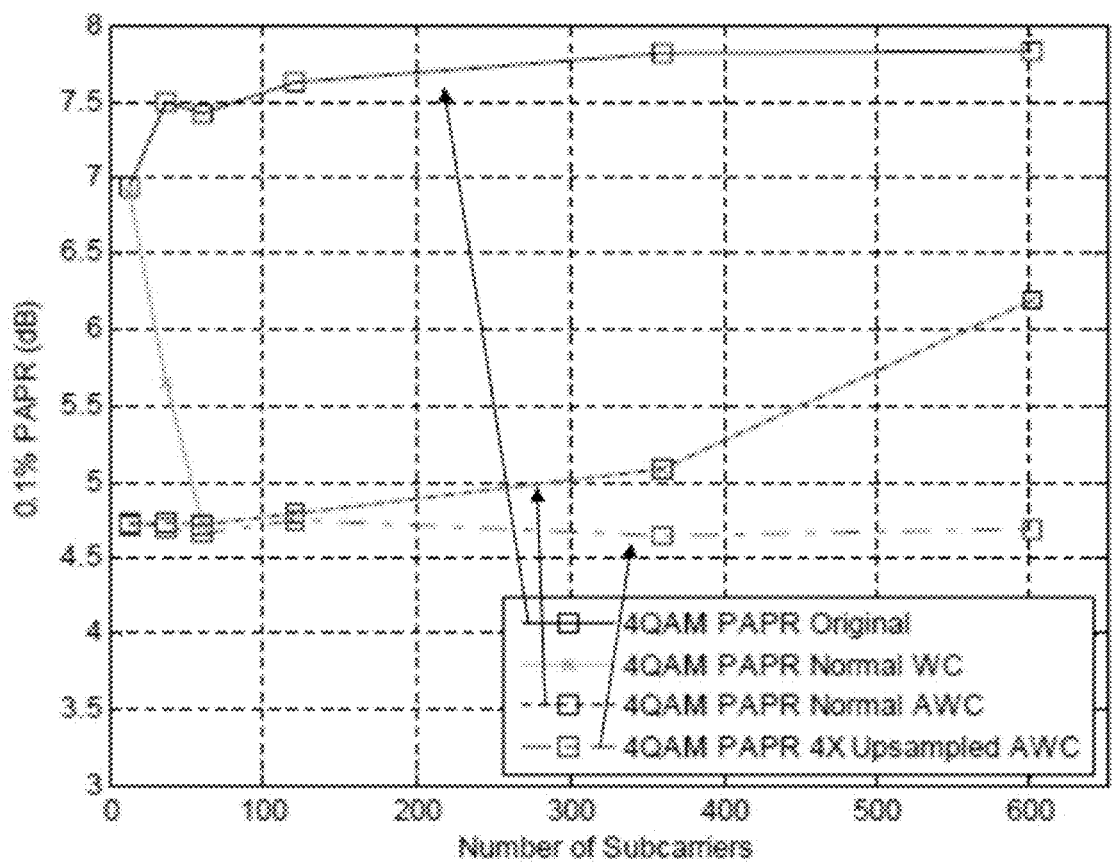
FIG. 8 shows a plot of peak-to-average power ratio with 4QAM signals.
Figure 9:
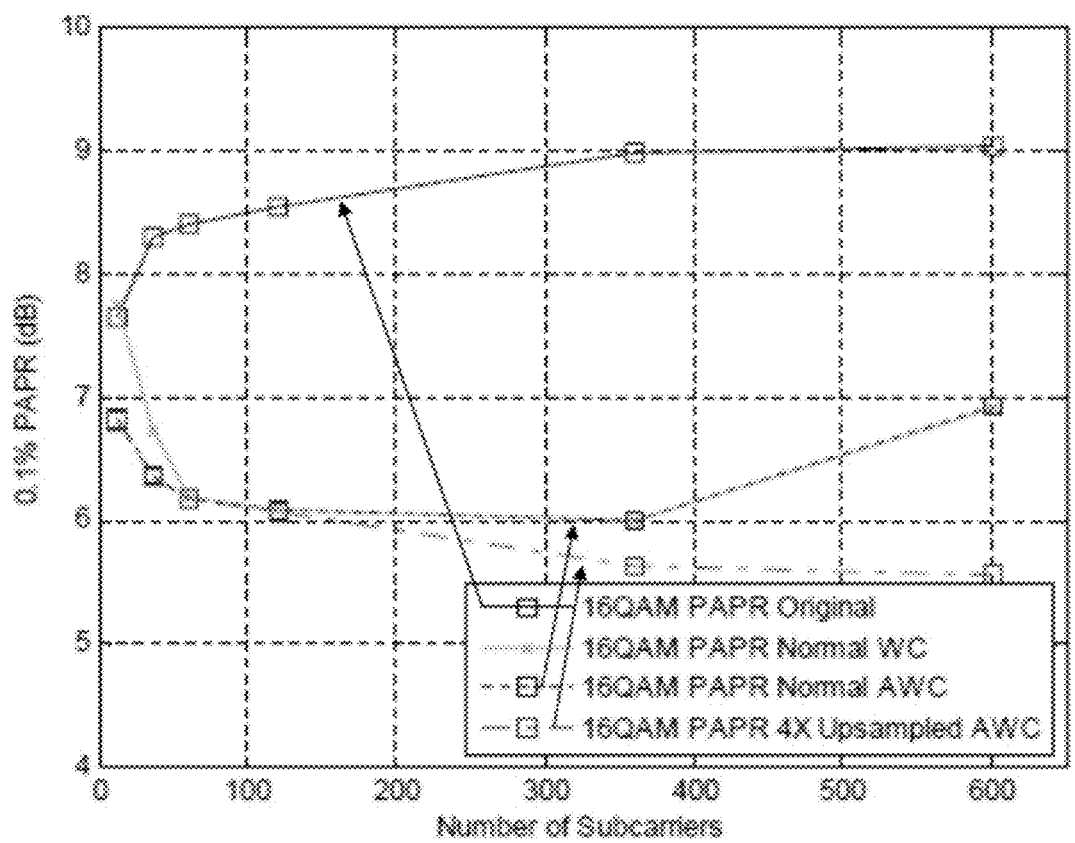
FIG. 9 shows a plot of peak-to-average power ratio with 16QAM signals.
Figure 10:
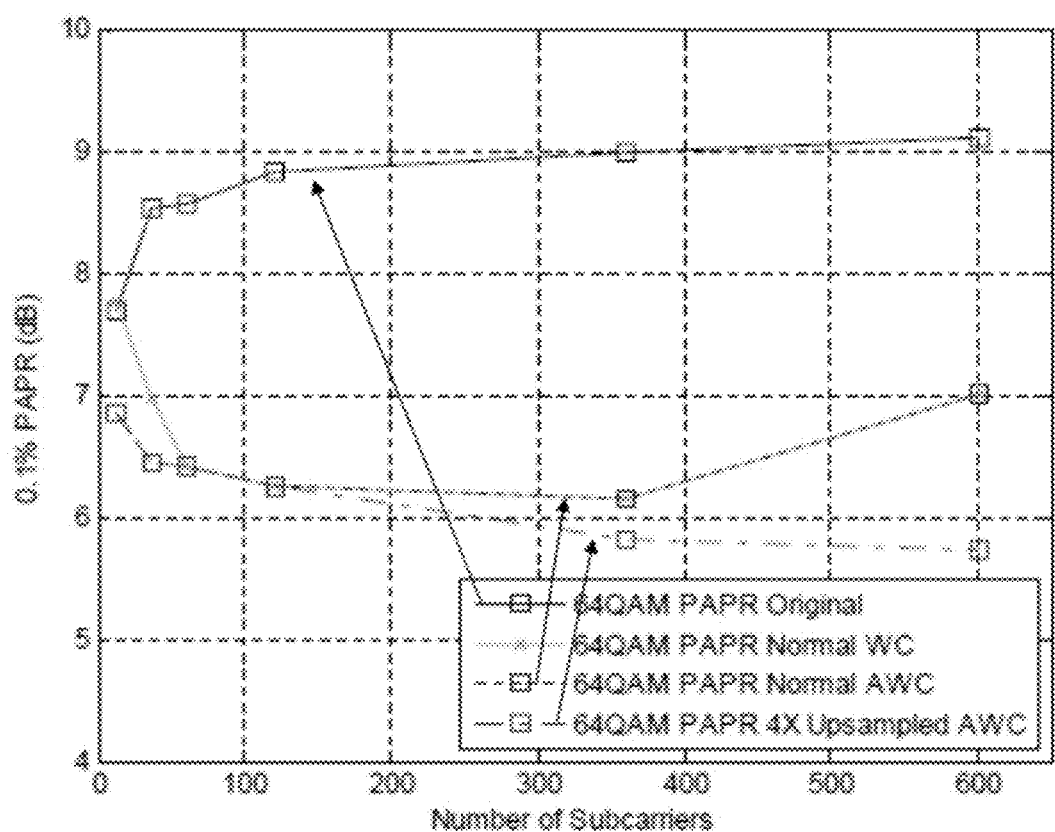
FIG. 10 shows a plot of peak-to-average power ratio with 64QAM signals.

Plots of the peak-to-average power ratio for various 1.25 MHz LTE simulations are shown in FIGS. 8-10. The peak-to-average power ratio of a LTE SC-FDMA system with 4QAM using the above window clipping technique is shown in FIG. 8; the peak-to-average power ratio of a LTE SC-FDMA system with 16QAM using the above window clipping technique is shown in FIG. 9; and the peak-to-average power ratio of a LTE SC-FDMA system with 64QAM using the above window clipping technique is shown in FIG. 10. When not using the window clipping technique, the results from a 1.25 MHz LTE simulation showed that the peak-to-average power ratio was not reduced significantly where the peak signal is wide. Where the window applied at a four times upsampling, the window suppresses the peak-to-average power ratio maximally for all number of subcarriers.

An output from the clipping activator activates or deactivates window clipping in the processor dependent on whether one or more signal characteristics are being detrimentally affected to an undesirable extent. Deselecting window clipping is preferred where window clipping is causing an undesirable amount of bit error rate (BER), which ultimately affects the throughput. In one embodiment, a bit error rate of more than 5-10% results in substantial loss in throughput. A threshold for the bit error rate might be set based on the type of Forward Error Correction (FEC) scheme used by the protocol and other system design parameters.

In one embodiment, the clipping activator also changes the window clipping parameters by detecting interference resulting from power amplifier distortion. Furthermore, the clipping activator may utilize a priori knowledge of throughput impact (BER degradation) due to window clipping to determine whether window clipping is appropriate. It is possible to map out approximately the bit error rate degradation for different modulation schemes (4-QAM, 16-QAM, 64-QAM etc.) with different peak-to-average power ratio targets achieved by window clipping. For example, if an unacceptable amount of interference is detected by the clipping activator, the clipping activator will attempt different methods of window clipping until one alternative provides for acceptable levels of interference and throughput. If none of the alternatives provide for desirable amounts of detected interference and throughput, then window clipping is not applied.

In one embodiment, the clipping activator periodically scans frequencies or channels at which the potential intermodulation products might fall to check if those channels have any carrier activity. If activity is detected, the clipping activator adapts the window clipping parameters to reduce the peak-to-average power ratio without compromising throughput.

In one embodiment, the communication device may further optimize a pulse shaping filter to control the peak-to-average power ratio and out of band emission. With increasing width of pulse shaping, the out of band emission decreases and peak-to-average power ratio increases. The components for window clipping and the pulse shape filter may interface each other to provide desired peak-to-average power ratio, out of band emission, and/or bit error rate.

Using window clipping provides for less costly peak-to-average power ratio suppression mechanism than provided with other techniques, which is desirable for portable devices having limited power supplies. Although window clipping is described, the peak-to-average power ratio may also be reduced through other techniques. One such technique is to modify the subcarrier allocation on a per user basis by modifying a scheduler in the infrastructure. Although such a modification may be realized at a high cost, it may be used in conjunction with the window clipping method described herein.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.)

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. Furthermore, it is to be understood that the invention is defined by the appended claims. Accordingly, the invention is not to be restricted except in light of the appended claims and their equivalents.

The invention claimed is:

1. A method for controlling peak-to-average power ratio of a signal in a communications system, the method comprising:
sampling the signal to provide a plurality of samples; predicting where a peak sample is located in the sampled signal; determining whether to adjust a length of a window based on a peak width, wherein the window length is adjusted when the window length is smaller than a peak width associated with the peak sample; and
clipping the samples using the window to form a window clipped signal prior to power amplifying the window clipped signal
wherein determining whether to adjust the window length comprises determining the peak width from a number of subcarriers used to transmit the signal.

2. The method of claim 1, wherein determining whether to adjust the window length comprises determining the peak width from the samples.

3. The method of claim 1, wherein the window length is narrowed as a number of subcarriers used to transmit the signal increases or as a number of samples greater than a predetermined threshold decreases.

4. The method of claim 1, further comprising:
interpolating a predetermined number of samples nearest to the predicted peak sample;
detecting a location and value of a true peak from the interpolated samples;
determining whether the true peak exceeds a predetermined threshold; and
clipping the samples only if the true peak exceeds the predetermined threshold.

5. The method of claim 1, wherein predicting where the peak sample is located comprises:
determining whether a current sample is greater than a first threshold and is a local maximum;
when the current sample is greater than the first threshold and is the local maximum, determining whether at least one of predetermined conditions is met, the predetermined conditions including:
a sum of the current sample and an immediately previous sample to the current sample is greater than a second threshold, a sum of the current sample and an immediately next sample to the current sample is greater than the second threshold, or the current sample exceeds a third threshold greater than the first threshold; and determining that the peak sample is present when at least one of the predetermined conditions is met.

6. The method of claim 1, wherein predicting where the peak sample is located comprises:

determining whether a current sample is greater than a first threshold;

when the current sample is greater than the first threshold, incrementing a peak counter;

after incrementing the peak counter determining whether at least one of predetermined conditions is met, the predetermined conditions including:

the peak counter exceeds a second threshold, or the current sample exceeds an immediately next sample to the current sample; and determining that the peak sample is present when at least one of the predetermined conditions is met.

7. The method of claim 1, further comprising determining whether to apply a peak suppression window prior to predicting the peak sample by at least:

determining whether an initial sample exceeds a predetermined suppression threshold;

when the initial sample exceeds the suppression threshold, determining whether a predetermined number of samples following the initial sample also exceeds the suppression threshold; and applying the peak suppression window when the predetermined number of samples following the initial sample also exceeds the suppression threshold.

8. The method of claim 7, wherein the suppression threshold is determined based on peak widths for different subcarrier loading cases and operating sampling rates.

9. The method of claim 1, further comprising:

determining whether window clipping is appropriate using throughput impact due to window clipping; and deactivating window clipping when it is determined that it is not appropriate to use window clipping.

10. The method of claim 9, wherein determining whether window clipping is appropriate comprises determining a bit error rate degradation for different modulation schemes with different peak-to-average power ratio targets achieved by window clipping and using the bit error rate degradation to decide whether window clipping is appropriate.

11. The method of claim 10, wherein determining whether window clipping is appropriate further comprises:

iterating through different window clipping techniques when it is determined that a particular window clipping technique results in an unacceptable amount of interference and throughput reduction until an acceptable window clipping technique that results in an acceptable amount of interference and throughput is determined;

using the acceptable window clipping technique if the acceptable window clipping technique is found; and determining that window clipping is not appropriate if none of the different window clipping techniques provides the acceptable amount of interference and throughput.

12. The method of claim 1, further comprising optimizing, based on the window clipping, a pulse shaping filter to which the signal is applied to control at least one of the peak-to-average power ratio, out of band emission or bit error rate of the signal.

13. The method of claim 1, wherein predicting where the peak sample is located comprises using multiple thresholds initially programmed to be a fixed value based on system design and power amplifier linearity and dynamically adjusted in an adaptive manner based on an estimate of a number of active subcarriers used in the signal or using an estimation of various interferers present in the communication system.

14. The method of claim 1, further comprising interpolating a predetermined number of samples nearest to the predicted peak sample and shifting a center of the window from the peak sample by a predetermined ratio of the distance between adjacent samples dependent on the interpolation.

15. A method for controlling peak-to-average power ratio of a signal in a transmitter, the method comprising:

sampling the signal to provide a plurality of samples;

adjusting parameters of a window dependent on interference resulting from power amplifier distortion to adjust the peak-to-average power ratio, wherein adjusting window clipping parameters comprises:

periodically scanning channels at which potential intermodulation products of the power amplified signal may fall to check if those channels have carrier activity, and if carrier activity is detected, adjusting the window clipping parameters to reduce the peak-to-average power ratio without compromising throughput; and clipping the samples using the window to form a window clipped signal prior to power amplifying the window clipped signal.

16. The method of claim 15, further comprising determining whether to adjust a window length from a peak width from the samples or a number of subcarriers used to transmit the signal.

17. The method of claim 15, further comprising determining whether to apply a peak suppression window by at least:

determining whether an initial sample exceeds a predetermined suppression threshold;

when the initial sample exceeds the suppression threshold, determining whether a predetermined number of samples following the initial sample also exceeds the suppression threshold; and applying the peak suppression window when the predetermined number of samples following the initial sample also exceeds the suppression threshold.

18. The method of claim 15, further comprising:

determining whether window clipping is appropriate by at least determining a bit error rate degradation for different modulation schemes with different peak-to-average power ratio targets achieved by window clipping and using the bit error rate degradation to decide whether window clipping is appropriate; and deactivating window clipping when it is determined that it is not appropriate to use window clipping.

19. The method of claim 15, further comprising predicting where a peak sample is located using multiple thresholds initially programmed to be a fixed value based on system design and power amplifier linearity and dynamically adjusted in an adaptive manner based on an estimate of a number of active subcarriers used in the signal or using an estimation of interferers present in the communication system.

* * * * *